(12) United States Patent
Liu et al.

(10) Patent No.: US 6,225,203 B1
(45) Date of Patent: May 1, 2001

(54) PE-SIN SPACER PROFILE FOR C2 SAC ISOLATION WINDOW

(75) Inventors: Jen-Cheng Liu, Chia-Yih; Jen-Shiang Leu; Chia-Shiung Tsai, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/304,334

(22) Filed: May 3, 1999

(51) Int. Cl.[7] ............... H01L 21/302; H01L 24/461; H01L 21/8238; H01L 21/8242; H01L 21/20

(52) U.S. Cl. ............... 438/595; 438/199; 438/253; 438/396; 438/705; 438/706; 438/734; 438/744

(58) Field of Search ............... 438/734, 744, 438/595, 705, 706, 711, 714, 724, 696, 733, 253, 255, 396, 397, 238, 239, 199, 200

(56) References Cited

U.S. PATENT DOCUMENTS

| | | | |
|---|---|---|---|
| 5,480,814 | 1/1996 | Wuu et al. | 438/279 |
| 5,731,236 | 3/1998 | Chou et al. | 438/253 |
| 5,766,992 | 6/1998 | Chou et al. | 438/241 |
| 5,776,832 | 7/1998 | Hsieh et al. | 438/669 |
| 5,914,279 | * 6/1999 | Yang et al. | 438/724 |
| 5,981,369 | * 10/1999 | Yoshida et al. | 438/597 |
| 6,037,216 | * 3/2000 | Liu et al. | 438/253 |

* cited by examiner

Primary Examiner—Charles Bowers
Assistant Examiner—Thanhha Pham
(74) Attorney, Agent, or Firm—George O. Saile; Stephen B. Ackerman; Rosemary L. S. Pike

(57) ABSTRACT

A method of forming a PE-CVD silicon nitride spacer having a good profile in the fabrication of a self-aligned contact wherein a two-step etching process forms the spacer is described. Semiconductor device structures are formed on a semiconductor substrate. A layer of silicon nitride is deposited by plasma-enhanced chemical vapor deposition over the surface of the substrate and overlying the semiconductor device structures. The silicon nitride layer is etched away using a two-step etching process to leave silicon nitride spacers on the side surfaces of the semiconductor device structures. The two-step process comprises a first etching away of 70% of the silicon nitride layer using $Cl_2$/He chemistry and a second etching away of the remaining silicon nitride on top surface of the semiconductor device strucutures using $SF_6$/$CHF_3$/He chemistry.

18 Claims, 6 Drawing Sheets

PE-SIN SPACER PROFILE FOR C2 SAC ISOLATION WINDOW

BACKGROUND OF THE INVENTION (1) Field of the Invention

The invention relates to the fabrication of integrated circuit devices, and more particularly, to a method of improving the SiN spacer profile in the process of forming a self-aligned contact opening in the fabrication of integrated circuits.

(2) Description of the Prior Art

The self-aligned contact (SAC) technology has been widely adopted to reduce device area in the fabrication of integrated circuit devices. For example, in forming a SAC for a capacitor between bit lines, the bit lines having silicon nitride spacers on their sidewalls are formed over an insulating layer. A silicon oxide layer covers the bit lines and silicon nitride spacers. A contact opening is etched through the silicon oxide layer to the underlying node contact region. The contact is self-aligned because the silicon nitride spacers are not etched by the silicon oxide etch and thereby form the contact opening.

Typically, a low-pressure furnace deposition is used for the silicon nitride spacer material (LP-SiN) at a temperature of about 800° C. However, for embedded dynamic random access memory (DRAM) devices, it is desirable to reduce the thermal budget to minimize the impact on the titanium silicide in the logic region. Therefore, it is desirable to deposit the silicon nitride spacer material by plasma-enhanced chemical vapor deposition. This presents the problem of how to etch the silicon nitride to form spacers having a good profile.

U.S. Pat. 5,766,992 and 5,731,236, both to Chou et al disclose a PECVD silicon nitride layer etched using $SF_6$ or $CHF_3$ to form spacers. U.S. Pat. No. 5,776,832 to Hsieh et al teaches using $CHF_3$ to etch an opening through a dielectric layer.

SUMMARY OF THE INVENTION

Accordingly, it is a principal object of the present invention to provide an effective and very manufacturable method of forming a silicon nitride spacer having a good profile.

It is a further object of the invention to provide a method of forming a self-aligned contact wherein a silicon nitride spacer of high quality is provided.

Yet another object of the invention is to provide a method of forming a PE-CVD silicon nitride spacer having a good profile in the fabrication of a self-aligned contact.

A still further object is to provide a method of forming a PE-CVD silicon nitride spacer having a good profile in the fabrication of a self-aligned contact wherein a two-step etching process forms the spacer.

In accordance with the objects of this invention a method of forming a PE-CVD silicon nitride spacer having a good profile in the fabrication of a self-aligned contact wherein a two-step etching process forms the spacer is achieved. Semiconductor device structures are formed on a semiconductor substrate. A layer of silicon nitride is deposited by plasma-enhanced chemical vapor deposition over the surface of the substrate and overlying the semiconductor device structures. The silicon nitride layer is etched away using a two-step etching process to leave silicon nitride spacers on the side surfaces of the semiconductor device structures. The two-step process comprises a first etching away of 70 to 85% of the silicon nitride layer using $Cl_2$/He chemistry and a second etching away of the remaining silicon nitride on the top surface of the semiconductor device structures using $SF_6$/$CHF_3$/He chemistry.

BRIEF DESCRIPTION OF THE DRAWINGS

In the accompanying drawings forming a material part of this description, there is shown.

DESCRIPTION OF THE PREFERRED EMBODIMENTS

Figure 1:
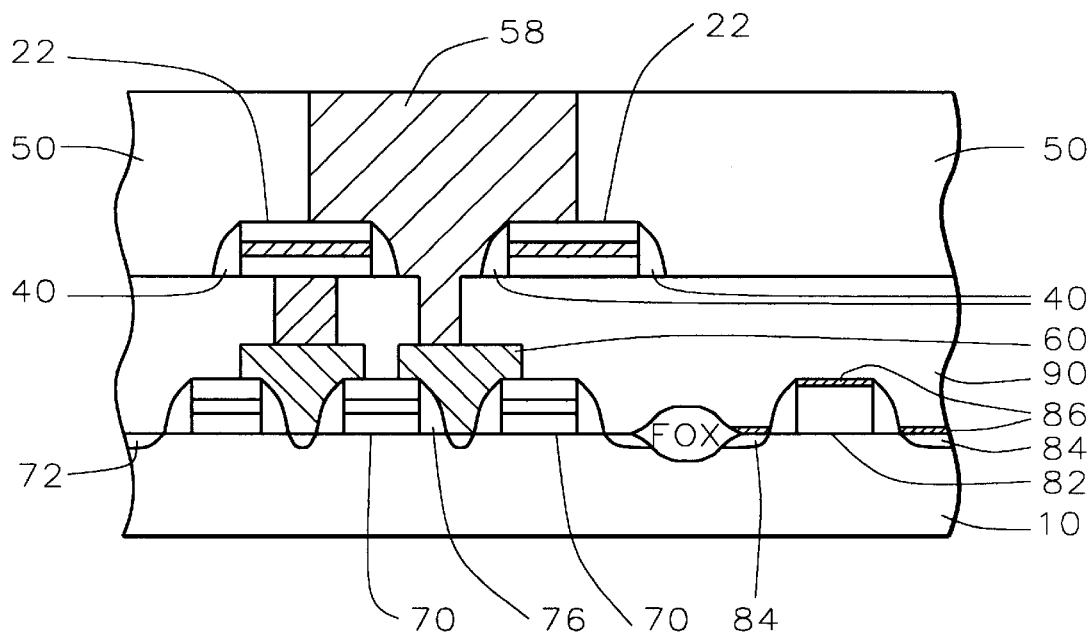
FIGS. 1 through 4 and 6 through 9 schematically illustrate in cross-sectional representation a preferred embodiment of the present invention.

The process of the present invention can be used in any application in which silicon nitride spacers are to be formed after a PE-CVD silicon nitride deposition. For purposes of illustration, the invention will be described with reference to FIGS. 1 through 8 which illustrate a process for forming a SAC for a capacitor between bit lines. FIG. 1 illustrates the SAC capacitor to be formed by the process of the invention. Bit lines 22 are shown having the PE-CVD silicon nitride spacers 40 of the present invention. Gate electrodes 70 have first been formed on a semiconductor substrate 10, preferably composed of silicon having a (100) crystallographic orientation. Source and drain regions 72 have been formed adjacent to the gate electrodes in the semiconductor substrate. The spacers 76 on the sidewalls of the gate electrodes may be conventional LP-SiN spacers or they may be PE-SiN spacers formed by the process of the invention. To the right of FIG. 1, there is illustrated a logic device 82 in a peripheral area of the wafer. The logic device 82 and source and drain regions 84 have been silicided 86. Therefore, in forming the PE-SiN spacers 40, it is important to have a minimal thermal budget to minimize the impact on the titanium silicide 86 in the logic region.

It should be understood by those skilled in the art that the invention is not limited to the self-aligned contact embodiment of FIGS. 1 through 8, but is equally applicable to any application in which spacers are to be formed from PE-CVD silicon nitride.

Figure 2:
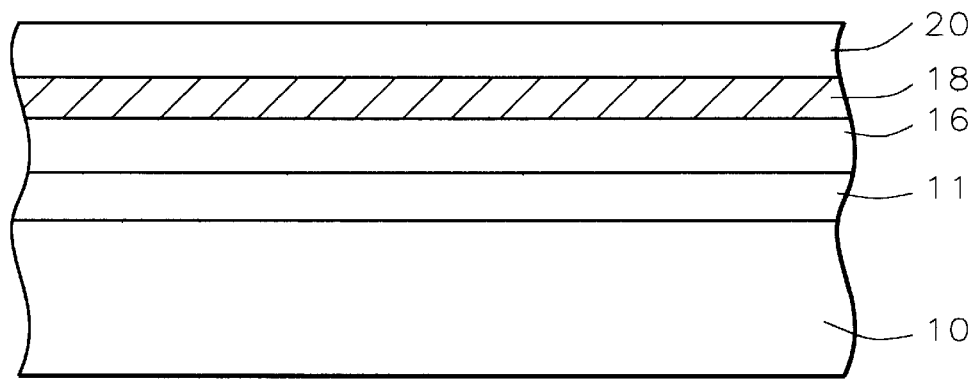

Referring now more particularly to FIG. 2, there is shown an illustration of a portion of a partially completed memory cell. In an effort to simplify the description and the drawings the dielectric isolation between devices has been only partially shown and will not be described in detail, because they are conventional. It is to be understood that the substrate 10 may include an insulating layer 11 such as the silicon oxide layer 90, shown in FIG. 1, covering semiconductor device structures, not shown in the following figures.

The polysilicon layer 16 is deposited by low pressure chemical vapor deposition (LPCVD) to a typical thickness of between about 800 to 1000 Angstroms over the oxide layer 11. The polysilicon layer may be doped or ion implanted. Optionally, a tungsten silicide layer 18 may be deposited by chemical vapor deposition (CVD) to a typical thickness of between about 800 to 1000 Angstroms. A hard mask layer, such as silicon oxynitride, 20 may be formed over the silicide layer 18.

Figure 3:
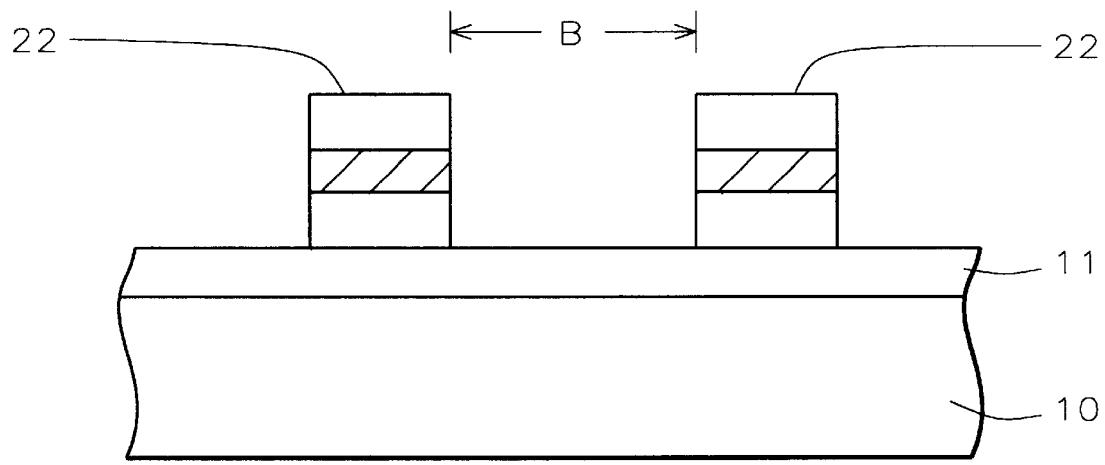

The layers 16, 18, and 20 are patterned by conventional lithography and anisotropic etching techniques to provide a desired pattern of poly stacks such as bit lines 22 as shown in FIG. 3. The spacing B between the bit lines may be 0.25 to 0.5 microns or smaller.

Figure 4:
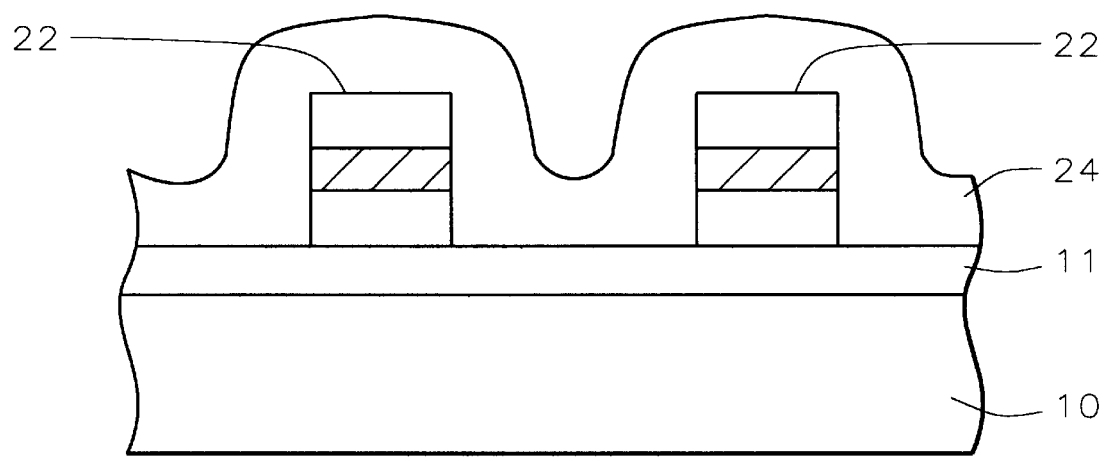

A layer of silicon nitride 24 is blanket deposited using plasma-enhanced chemical vapor deposition (PECVD) typically to a thickness of between about 1500 to 2000 Angstroms over the wafer's exposed surfaces, as shown in FIG. 4. The temperature of PECVD is about 400° C., thus saving thermal budget over a furnace deposition process. The silicon nitride layer 24 is to be etched to form silicon nitride spacers on the sidewalls of the gate electrode stacks.

Figure 5A:
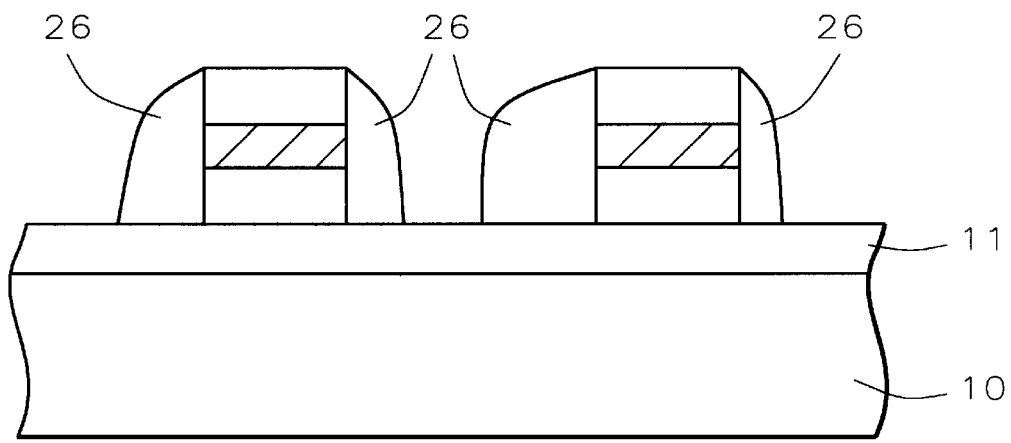
FIGS. 5A through 5D schematically illustrate in cross-sectional representation poor spacer profiles.
Figure 5B:
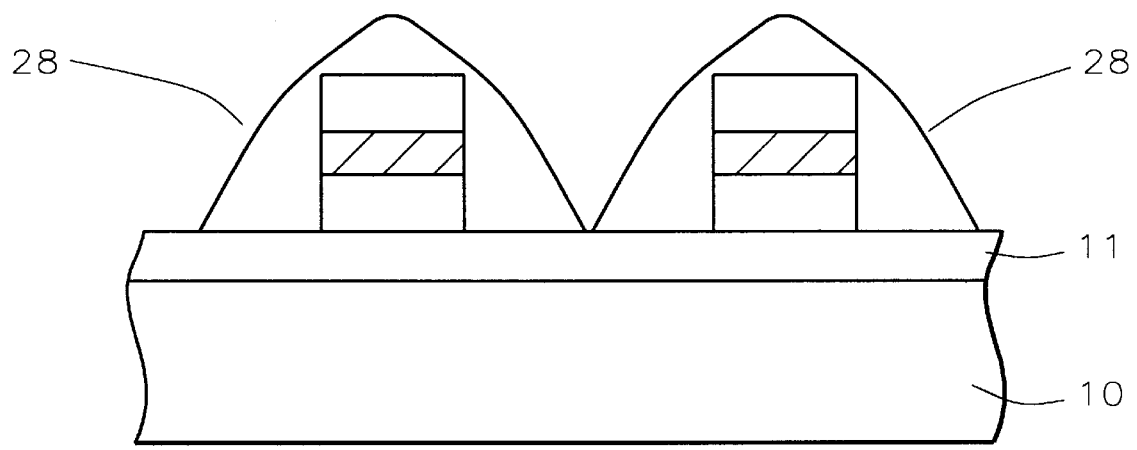

It is important that the spacer profile be a good one. The criteria for a good spacer profile include good polycide isolation and adequate spacer width. For low pressure (LP) furnace-deposited silicon nitride, the spacer etch typically uses $SF_6$/He chemistry in a plasma-mode etching chamber. This results in a good spacer profile for the furnace silicon nitride. However, if this etching recipe is used for PECVD silicon nitride, a very poor spacer profile results. For example, FIG. 5A illustrates a resulting spacer profile 26.

The inventors also experimented with using $CHF_3$/Ar chemistry in a MERIE mode chamber. This resulted in the triangular spacer profile 28 illustrated in FIG. 5B. This profile is due to the equipment design concept of the MERIE chamber. Because of high physical bombardment etching, the triangle shape emerges. This shape leaves the spacers too thin on top. There is a danger that they may be etched through during the SAC process. This recipe and equipment does result in a good spacer profile if used with LP furnace-deposited silicon nitride.

Figure 5C:
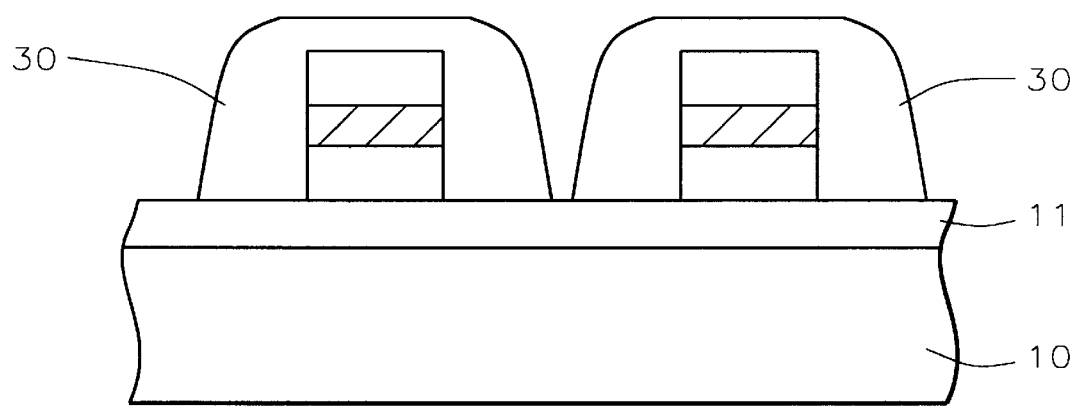
Figure 5D:
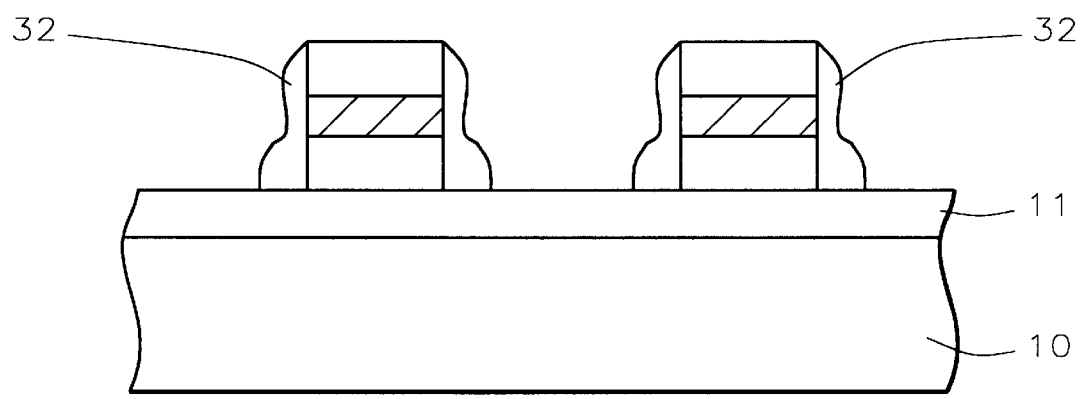

The inventors experimented with using $Cl_2$/He chemistry in a plasma-mode chamber. However, the endpoint could not be detected since there is no sulfur source. FIG. 5C illustrates spacer profile 30, also undesirable. The spacers 30 are too thick.

$SF_6$/$CHF_3$/He chemistry was tried in a plasma-mode chamber. $CHF_3$ was added for polymer passivation. This resulted in the spacer profile 32 shown in FIG. 5D.

Figure 6:
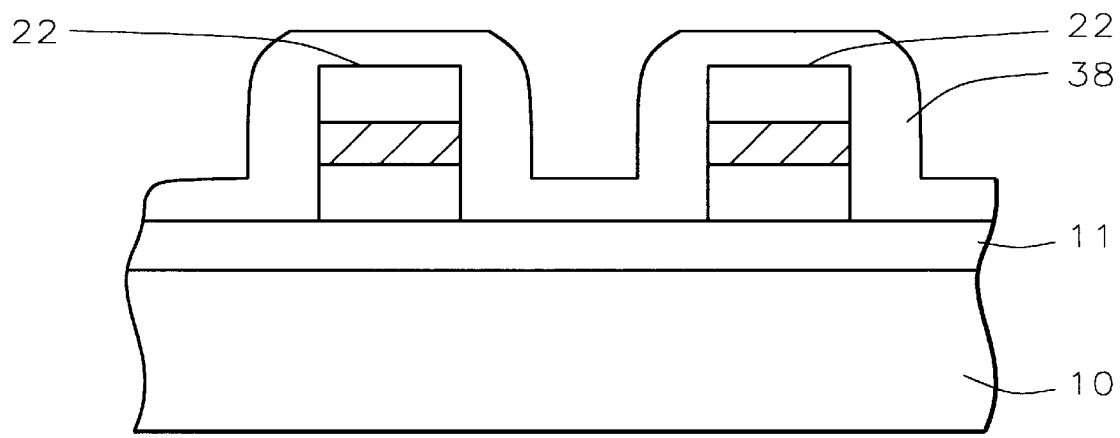
Figure 7:
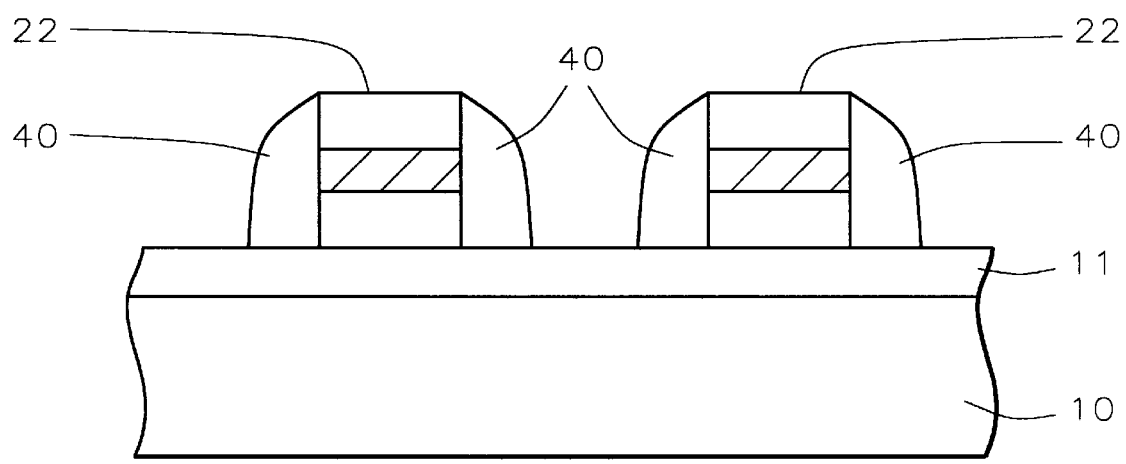
Figure 8:
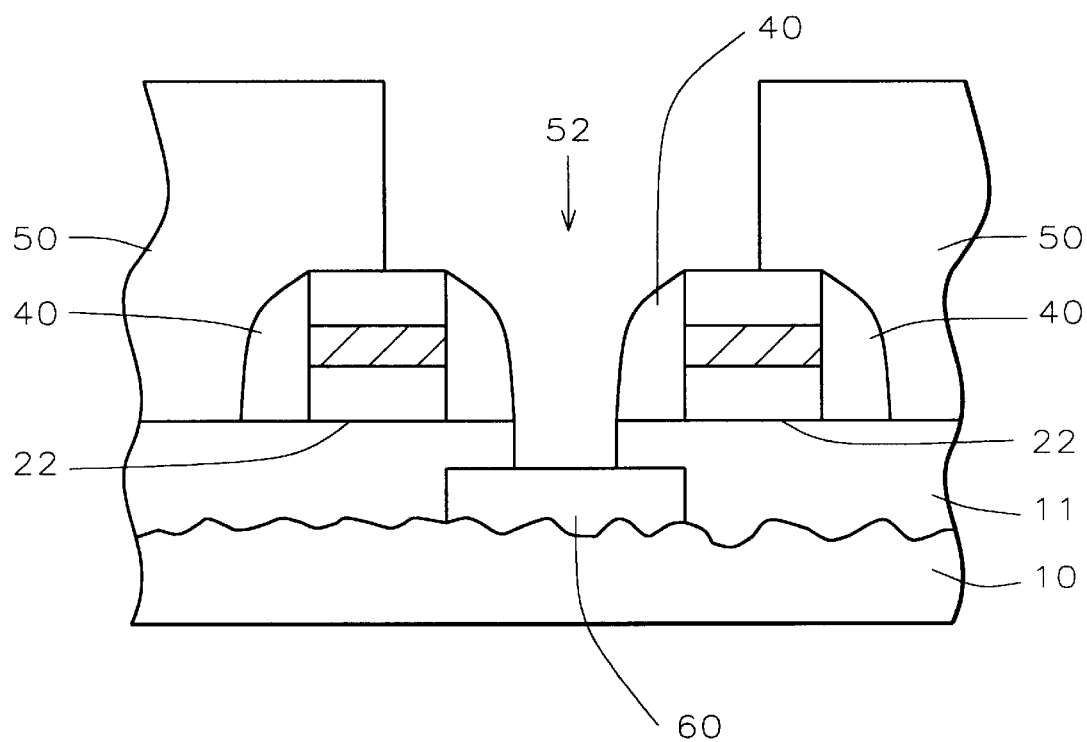

The inventors have devised a two-step etching process which resolves the etching problems and results in a good spacer profile. In the first step, $Cl_2$/He chemistry is used in a plasma-mode chamber. A partial etching is done so that etch rate can be determined and then used to calculate etch time. 70 to 85% of the spacer is etched in this step. FIG. 6 illustrates the partial etching of the spacers 38 after the first etch step. Some of the silicon nitride film remains on top of the bit lines 22.

In the second step, $CHF_3$/$SF_6$/He chemistry is used for endpoint detection. This etching recipe results in the silicon nitride spacers 40 illustrated in FIG. 7 having a good profile.

The etching recipe comprises, in the first step, flowing $Cl_2$ gas at 130 to 140 sccm and flowing He at 70 to 80 sccm at a pressure of 300 to 350 mtorr and a power of 300 to 400 watts for 100 to 130 seconds. In the second step, $SF_6$ is flowed at 40 to 50 sccm, $CHF_3$ is flowed at 30 to 60 sccm, and He is flowed at 180 to 200 sccm at a pressure of 200 to 300 mtorr and a power of 150 to 200 watts for 27 to 34 seconds.

Processing now continues as is conventional in the art to form the SAC. For example, referring now to FIG. 8, an insulating layer 50 of silicon oxide is deposited by CVD to a thickness of between about 14,000 and 16,000 Angstroms over the surface of the wafer.

Now, the self-aligned contact photolithography and etching is performed. The silicon oxide layer 50 is etched away to form an opening 52 to an underlying node contact region 60. Reactive ion etching or the like may be used. The silicon nitride spacers 40 are not etched away during the silicon oxide etching thereby forming the self-aligned contact opening 52, shown in FIG. 8. The silicon nitride spacers 40 will prevent a short between the gate electrode 20 and the conducting layer to be deposited within the contact opening 52.

Figure 9:
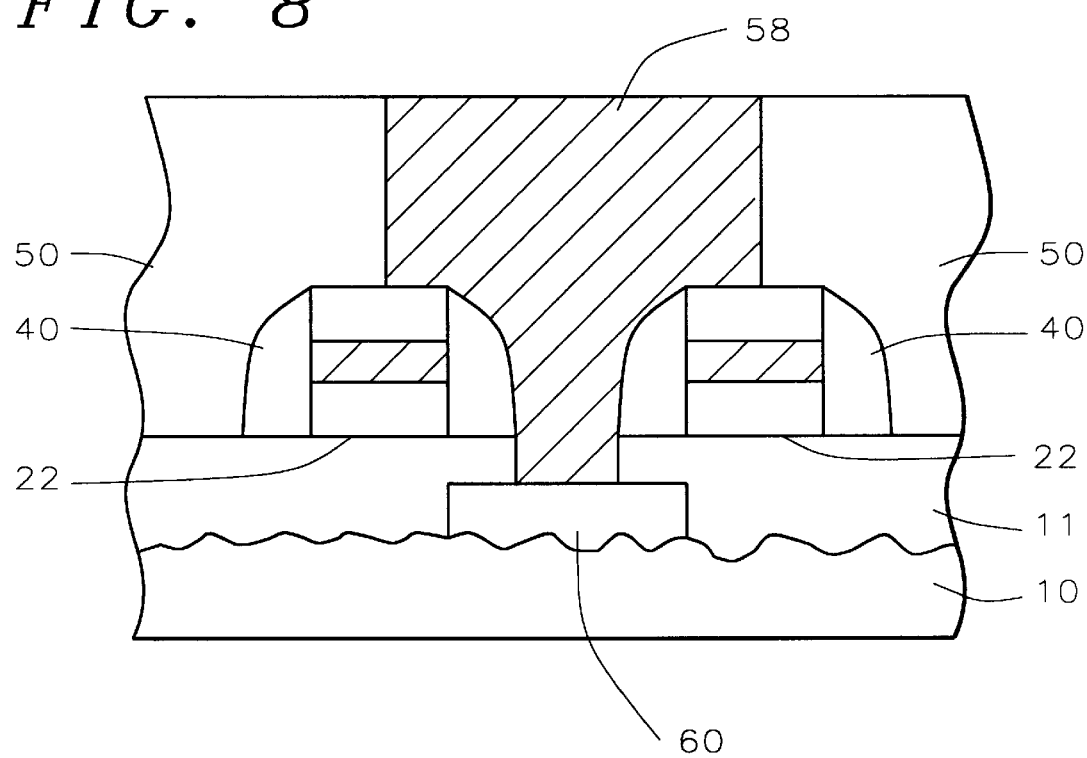

Referring now to FIG. 9, a conducting layer 58 is deposited over the surface of the insulating layer and within the contact opening to contact the node contact region 60. The conducting layer may be polysilicon or a metal such as tungsten, aluminum, or the like.

As shown in FIG. 1, the conducting layer 58 may form a capacitor between bit lines 22. Here, the node contact region 60 is the first level SAC between gate electrodes 70.

The process of the present invention provides a very manufacturable method of forming silicon nitride spacers having a good profile. These spacers may be used in any application, including a self-aligned contact in which the good profile spacers prevent a short between the bit lines and the conducting layer within the SAC opening. The spacers are deposited by PE-CVD to reduce the thermal budget in applications where that is critical, such as embedded DRAM where silicided logic circuits must be protected. The two-step etching recipe of the present invention provides spacers having good isolation and width.

While the invention has been particularly shown and described with reference to the preferred embodiments thereof, it will be understood by those skilled in the art that various changes in form and details may be made without departing from the spirit and scope of the invention.

What is claimed is:

1. A method of forming silicon nitride spacers in the fabrication of an integrated circuit comprising:

forming semiconductor device structures on a semiconductor substrate wherein said semiconductor device structures have top and side surfaces;

depositing a layer of silicon nitride over the surface of said semiconductor substrate and overlying said semiconductor device structures; and etching away said silicon nitride layer using a two-step etching process comprising:

first etching away 70 to 85% of said silicon nitride layer using $Cl_2$ and He chemistry; and second etching away remaining said silicon nitride on said top surface of said semiconductor device structures layer using $SF_6$, $CHF_3$, and He chemistry to leave said silicon nitride spacers on said side surfaces of said semiconductor device structures in the manufacture of said integrated circuit device.

2. The method according to claim 1 wherein said semiconductor device structures are bit lines.

3. The method according to claim 1 wherein said silicon nitride layer is deposited by plasma-enhanced chemical vapor deposition.

4. The method according to claim 1 wherein said $Cl_2$ and He chemistry comprises 130 to 140 sccm of $Cl_2$ and 70 to 80 sccm of He at a pressure of 300 to 350 mtorr and power of 300 to 400 watts for a duration of 100 to 130 seconds.

5. The method according to claim 1 wherein said $SF_6$$CHF_3$, and He chemistry comprises 40 to 50 sccm of $SF_6$, 30 to 60 sccm of $CHF_3$, and 180 to 200 sccm of He at a pressure of 200 to 300 mtorr and power of 150 to 200 watts for a duration of 27 to 34 seconds.

6. A method of forming a self-aligned contact in the fabrication of an integrated circuit comprising:

forming semiconductor device structures on a semiconductor substrate wherein said semiconductor device structures have top and side surfaces;

depositing a layer of silicon nitride over the surface of said semiconductor substrate and overlying said semiconductor device structures by plasma-enhanced chemical vapor deposition;

etching away said silicon nitride layer using a two-step etching process comprising:

first etching away 70 to 85% of said silicon nitride layer using $Cl_2$ and He chemistry; and second etching away remaining said silicon nitride on said top surface of said silicon nitride layer using $SF_6$, $CHF_3$, and He chemistry to leave silicon nitride spacers on said side surfaces of said semiconductor device structures;

depositing a layer of silicon oxide over the surface of said semiconductor substrate and overlying said semiconductor device structures and said silicon nitride spacers wherein said silicon oxide contacts said semiconductor substrate adjacent to at least one of said semiconductor device structures where said self-aligned contact is to be formed;

covering said semiconductor substrate with a photoresist mask to provide an opening over planned said self-aligned contact;

etching away said silicon oxide where it is not covered by said photoresist mask to provide an opening to said semiconductor substrate wherein said silicon nitride spacers are not etched away within said opening; and depositing a conducting layer within said opening wherein said silicon nitride spacers within said opening prevent a short between said semiconductor device structures and said conducting layer to complete said self-aligned contact in the manufacture of said integrated circuit device.

7. The method according to claim 6 wherein said semiconductor device structures are bit lines overlying an insulating layer and wherein said self-aligned contact is to be made between said bit lines to a node contact region within said insulating layer and wherein said step of etching away said silicon oxide to provide an opening to said semiconductor substrate further comprises etching through said insulating layer to said node contact region.

8. The method according to claim 6 wherein said semiconductor device structures are gate electrodes and interconnection lines and wherein said self-aligned contact is to be made between said gate electrodes and interconnection lines to a source/drain region within said semiconductor substrate.

9. The method according to claim 6 wherein said step of depositing said silicon nitride layer is performed at a temperature of about 400° C.

10. The method according to claim 6 wherein said $Cl_2$ and He chemistry comprises 130 to 140 sccm of $Cl_2$ and 70 to 80 sccm of He at a pressure of 300 to 350 mtorr and power of 300 to 400 watts for a duration of 100 to 130 seconds.

11. The method according to claim 6 wherein said $SF_6$ $CHF_3$, and He chemistry comprises 40 to 50 sccm of $SF_6$, 30 to 60 sccm of $CHF_3$, and 180 to 200 sccm of He at a pressure of 200 to 300 mtorr and power of 150 to 200 watts for a duration of 27 to 34 seconds.

12. A method of forming silicon nitride spacers in the fabrication of an integrated circuit comprising:

forming semiconductor device structures on a semiconductor substrate wherein said semiconductor device structures have top and side surfaces;

depositing a layer of silicon nitride over the surface of said semiconductor substrate and overlying said semiconductor device structures wherein said silicon nitride layer is deposited by plasma-enhanced chemical vapor deposition; and etching away said silicon nitride layer using a two-step etching process to leave said silicon nitride spacers on said side surfaces of said semiconductor device structures wherein said two-step etching process comprises:

first etching away 70 to 85% of said silicon nitride layer using $Cl_2$ and He chemistry; and second etching away remaining said silicon nitride on said top surface of said semiconductor device structures using $SF_6$, $CHF_3$, and He chemistry to complete formation of said silicon nitride spacers in the manufacture of said integrated circuit device.

13. The method according to claim 12 wherein said semiconductor device structures are gate electrode stacks.

14. The method according to claim 12 wherein said semiconductor device structures are bit lines and wherein a self-aligned contact is to be made between said bit lines to a node contact region within said semiconductor substrate.

15. The method according to claim 12 wherein said $Cl_2$ and He chemistry comprises 130 to 140 sccm of $Cl_2$ and 70 to 80 sccm of He at a pressure of 300 to 350 mtorr and power of 300 to 400 watts for a duration of 100 to 130 seconds.

16. The method according to claim 12 wherein said $SF_6$, $CHF_3$ and He chemistry comprises 40 to 50 sccm of $SF_6$, 30 to 60 sccm of $CHF_3$, and 180 to 200 sccm of He at a pressure of 200 to 300 mtorr and power of 150 to 200 watts for a duration of 27 to 34 seconds.

17. The method according to claim 14 further comprising:

depositing a layer of silicon oxide over the surface of said semiconductor substrate and overlying said semiconductor device structures and said silicon nitride spacers wherein said silicon oxide contacts said semiconductor substrate adjacent to at least one of said semiconductor device structures where said self-aligned contact is to be formed;

covering said semiconductor substrate with a photoresist mask to provide an opening over planned said self-aligned contact;

etching away said silicon oxide where it is not covered by said photoresist mask to provide an opening to said node contact region within said semiconductor substrate wherein said silicon nitride spacers are not etched away within said opening; and depositing a conducting layer within said opening wherein said silicon nitride spacers within said opening prevent a short between said semiconductor device structures and said conducting layer to complete said self-aligned contact in the manufacture of said integrated circuit device.

18. The method according to claim 12 wherein said step of depositing said silicon nitride layer is performed at a temperature of about 400° C.

* * * * *